US006431309B1

(12) United States Patent
Coffin

(10) Patent No.: US 6,431,309 B1
(45) Date of Patent: Aug. 13, 2002

(54) LOUDSPEAKER SYSTEM

(76) Inventor: C. Ronald Coffin, 18 John's La., Topsfield, MA (US) 01983

( * ) Notice: Subject to any disclaimer, the term of this patent is extended or adjusted under 35 U.S.C. 154(b) by 0 days.

(21) Appl. No.: 09/550,087

(22) Filed: Apr. 14, 2000

(51) Int. Cl.[7] .................................................. H05K 5/00

(52) U.S. Cl. ........................ 181/156; 181/145; 181/163; 381/159

(58) Field of Search ................................ 181/156, 155, 181/145, 148, 160, 163, 199; 381/159, 153

(56) References Cited

U.S. PATENT DOCUMENTS

| | | | | | |
|---|---|---|---|---|---|
| 3,684,051 | A | | 8/1972 | Hopkins | 181/31 |
| 4,408,678 | A | | 10/1983 | White, Jr. | 181/199 |
| 4,549,631 | A | | 10/1985 | Bose | 181/155 |
| 4,595,801 | A | * | 6/1986 | Coffin | 179/115.5 PS |
| 4,628,528 | A | * | 12/1986 | Bose et al. | 381/90 |
| 4,783,820 | A | * | 11/1988 | Lyngdorf et al. | 381/89 |
| 4,790,408 | A | * | 12/1988 | Adair | 181/152 |
| 4,875,546 | A | * | 10/1989 | Krnan | 181/160 |
| 5,010,977 | A | * | 4/1991 | Furukawa et al. | 181/160 |
| 5,025,885 | A | | 6/1991 | Froeschle | 181/156 |
| 5,092,424 | A | * | 3/1992 | Schreiber et al. | 181/145 |
| 5,189,706 | A | * | 2/1993 | Saeki | 381/159 |
| 5,353,261 | A | * | 10/1994 | Kakiuchi et al. | 367/140 |
| 5,471,019 | A | * | 11/1995 | Maire | 181/156 |
| 5,475,674 | A | | 12/1995 | Polk | 381/159 |
| 5,519,178 | A | | 5/1996 | Ritto et al. | 181/199 |
| 5,576,522 | A | | 11/1996 | Taso | 181/199 |
| 5,583,324 | A | | 12/1996 | Thomasen | 181/199 |
| 5,629,503 | A | | 5/1997 | Thomasen | 181/199 |
| 5,639,996 | A | | 6/1997 | Tan | 181/199 |
| 5,714,721 | A | | 2/1998 | Gawronski et al. | 181/199 |
| 6,062,338 | A | * | 5/2000 | Thompson | 181/152 |
| 6,237,715 | B1 | * | 5/2001 | Tracy | 181/156 |

* cited by examiner

*Primary Examiner*—Robert E. Nappi
*Assistant Examiner*—Edgardo San Martin
(74) *Attorney, Agent, or Firm*—George A. Herbster

(57) ABSTRACT

A speaker system with a dual cone speaker having interconnected primary speaker and secondary speaker cones. An enclosure defines a first sub-chamber for interacting with the rear of the first speaker cone and a second sub-chamber for interacting with the rear of the second speaker cone. The sub-chambers may be sealed sub-chambers, ported sub-chambers or acoustic waveguides.

3 Claims, 10 Drawing Sheets

LOUDSPEAKER SYSTEM

BACKGROUND OF THE INVENTION

1. Field of the Invention

This invention generally relates to audio speaker systems and more specifically to speaker systems including loudspeakers and enclosures.

2. Description of Related Art

A continuing effort is being applied to the development of loudspeakers and enclosures for producing audio speaker systems that produce high-quality sound and that operate with maximum efficiency. This effort, in part, has been directed to developing different speaker enclosures with sealed chambers, vented or ported chambers and acoustic waveguides, particularly for optimizing the performance of bass speakers, woofers and sub-woofers.

My U.S. Pat. No. 4,595,801 and U.S. patent application Ser. No. 09/251,815 filed Feb. 17, 1999 disclose a dual cone loudspeaker with a primary annular speaker cone similar in function to a conventional dynamic loudspeaker mounted on a frame with a magnet structure adapted for operation as a bass loudspeaker or driver. A secondary speaker cone mounts to a sub-frame on the back of the magnet structure and connects to the primary speaker cone through a rigid coupling device so the primary and secondary speaker cones move in unison. Sound waves from the secondary speaker cone travel through an orifice extending through a center pole piece of the magnet structure and the primary speaker cone radiating in the same direction as sound waves from the primary speaker cone. Consequently for a given excursion of the primary speaker cone my dual cone structure generates a sound having a greater sound volume than the primary cone alone by virtue of the simultaneous excursions of both the primary and secondary speaker cones that move a greater air volume for a given speaker cone displacement.

This dual cone speaker can be mounted in a number of conventional enclosures with good results. However, it has been found that such enclosures can also detract from the performance of the dual cone loudspeaker especially when the combination of the enclosure and the loudspeaker impedes the performance of the loudspeaker. What is needed is an audio speaker system with an enclosure and a dual cone loudspeaker that will exhibit improved performance over a wide frequency range, particularly the bass frequency range.

SUMMARY

Therefore it is an object of this invention to provide loudspeaker systems with enclosures that are adapted to the characteristics of dual cone loudspeakers.

Another object of this invention is to provide loudspeaker systems with enclosures having different sub-chambers that enhance the performance of dual cone loudspeakers.

In accordance with this invention, a loudspeaker system includes a dual cone loudspeaker. A first sub-chamber in an enclosure interacts with a first speaker cone. A second subchamber interacts with the second speaker cone. The front surfaces of both speaker cones interact with same air mass.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBEDMENTS

Figure 1:
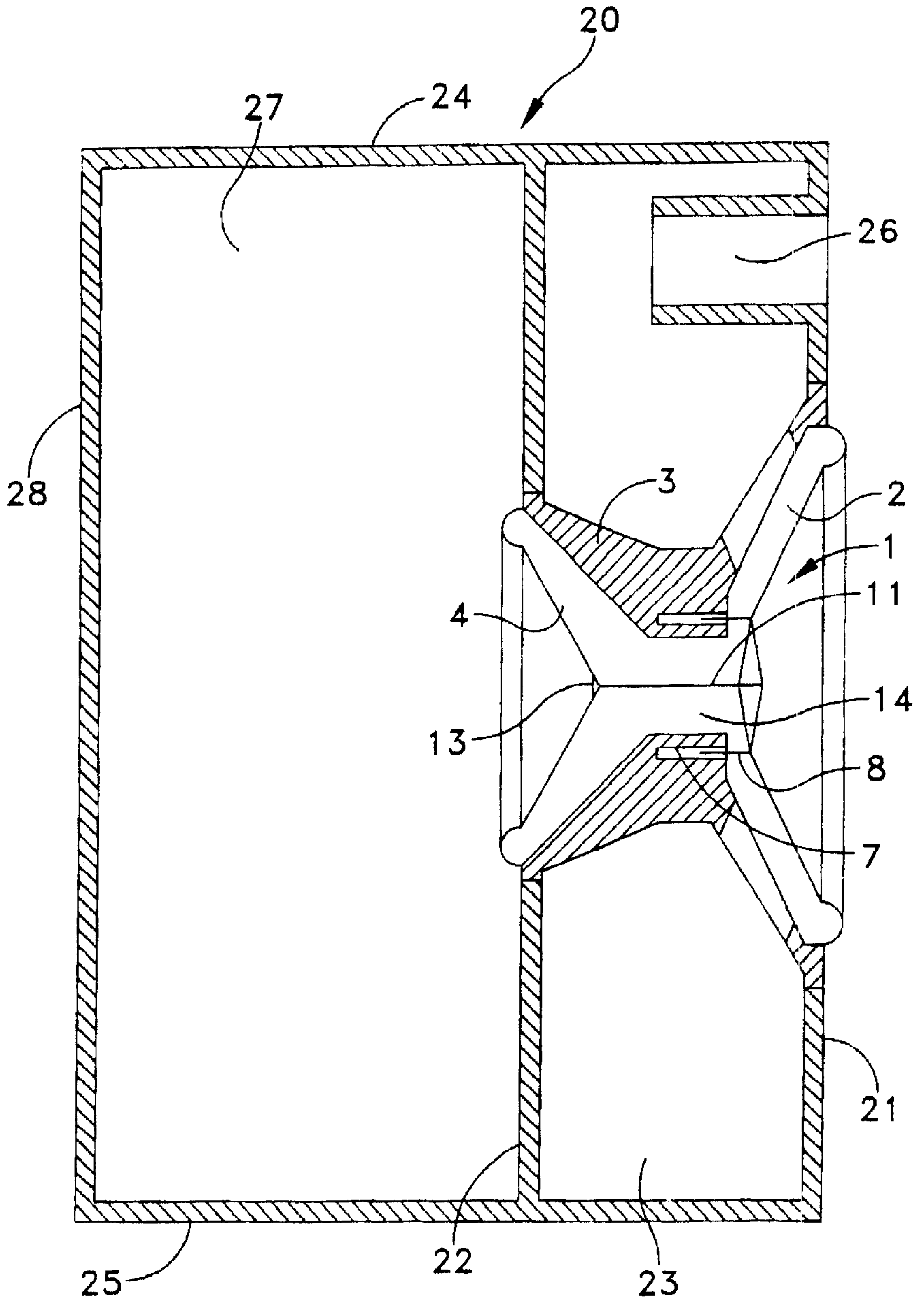
FIG. 1 is a cross section of a first embodiment of a loudspeaker system constructed in accordance with this invention.

FIG. 1 depicts, in a schematic view, a first embodiment of this invention including an enclosure 20 and a dual-cone loudspeaker as constructed in accordance with the aforementioned patent disclosures. For reference, the dual cone loudspeaker includes a rigid frame 1 to which a first speaker cone in the form of a primary speaker cone 2 is attached and a subframe 3 to which a second speaker cone in the form of a secondary speaker cone 4 is attached. Both frames 1 and 3 are mounted with a permanent magnet to which pole pieces are attached to form a magnetic field gap 7 into which a voice coil bobbin 8 with a voice coil is placed. The voice coil bobbin 8 attaches to the base of the primary speaker cone 2 that is resiliently suspended from the frame 1 by a flexible surround at its outer periphery and by a spider at its bottom. A rigid link 11 mechanically connects the voice coil bobbin 8 to the secondary speaker cone 4 by a center attachment 13 that may comprise a separate fastener or an adhesive material that bonds the link 11 to the secondary speaker cone 4.

The secondary speaker cone 4 attaches to the subframe 3 through a flexible surround and forms a second air piston that is pneumatically coupled to the primary speaker cone 2 through an orifice or aperture 14 through the center of the magnetic structure comprising a permanent magnet and pole pieces.

FIG. 1 depicts, in schematic form, an enclosure 20 that carries the main frame 1 of the loudspeaker on a front panel 21 so that the front surface of the primary speaker cone 2 faces the exterior of the enclosure 20. A dividing wall 22 spaced from the front wall 21 serves as a boundary between a front sub-chamber 23 that also includes a top member 24 and a bottom member 25. The front sub-chamber 23 includes a passive radiating means in the form of a port 26 through the front wall 21. The dividing wall 22 carries the sub-frame 3 and forms a front boundary for a sealed sub-chamber 27 completed by the top wall 24, bottom wall 25 and a rear wall 28. As will be apparent, the enclosure 20 in FIG. 1 and the other various enclosures described below typically will include side walls to complete the any sub-chambers.

This configuration, made possible by the dual-cone loudspeaker, provides an enclosure designer with a wide-variety of variables for controlling the frequency characteristics of the system including both the enclosure and the loudspeaker. This variety results because the dual-cone loudspeaker has four ;radiating surfaces that can interface with three or more defined air masses. In FIG. 1, the rear surface of the secondary speaker cone 4 faces the sealed sub-chamber 27. The rear surface of the primary speaker cone 2 faces the ported sub-chamber 23. The front surfaces of the secondary speaker cone and the primary speaker cone 2 act on the exterior air mass with the front surface of the secondary speaker cone 4 acting through the orifice 14. Thus the enclosure designer is provided with the ability to control the interaction between the dual-cone loudspeaker with three different sets of variables, namely: the volumes of the sealed sub-chamber 27 and the sub-chamber 23 and the air mass in the port 26.

Figure 2:
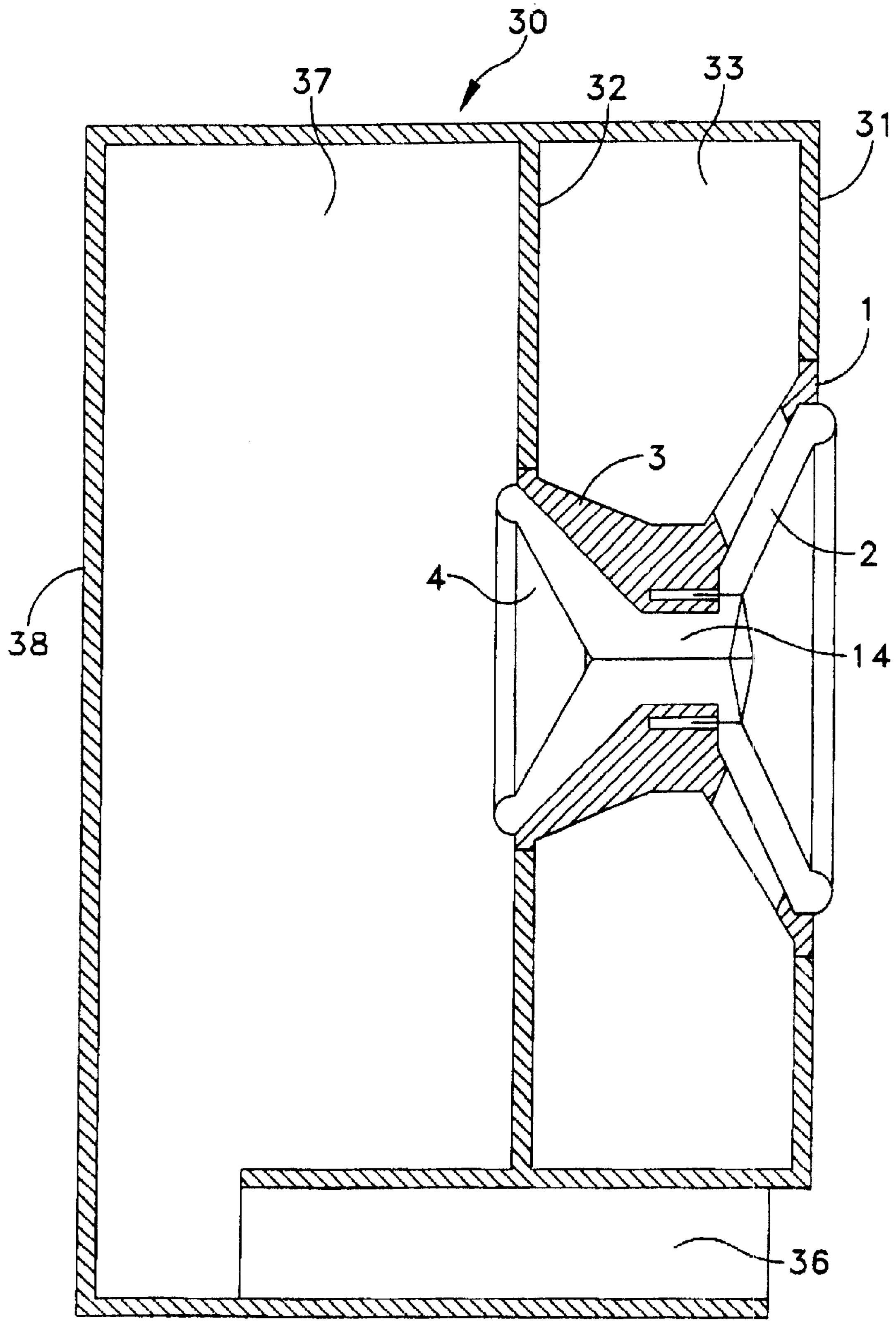
FIG. 2 is a cross section of a second embodiment of a loudspeaker system constructed in accordance with this invention.

FIG. 2 depicts, in schematic form, an enclosure 30 that carries the loudspeaker main frame 1 on a front panel 31 so that the front surface of the primary speaker cone 2 and front surface of the secondary speaker cone 4 interact with the air on the exterior of the enclosure 30. A dividing wall 32 spaced from the front wall 31 serves as a boundary between a sealed front sub-chamber 33 and a rear sub-chamber 37 completed by a rear wall 38. The rear sub-chamber 37 includes a passive radiating means in the form of a port 36 that exits through the front wall 31.

As in FIG. 1, the enclosure 30 in FIG. 2 and the dual-cone loudspeaker provide an enclosure designer with a wide-variety of variables for controlling the frequency characteristics of the system including both the enclosure and the loudspeaker. In FIG. 2, the rear surface of the secondary speaker cone 4 interacts with the rear sub-chamber 37 while the rear surface of the primary speaker cone 2 interacts with the front sealed sub-chamber 33. Thus the enclosure designer is provided with the ability to control the interaction between the dual-cone loudspeaker with three different sets of variables, namely: the volumes of the ported sub-chamber 37 and sealed sub-chamber 33 and the air mass in the port 36.

Figure 3:
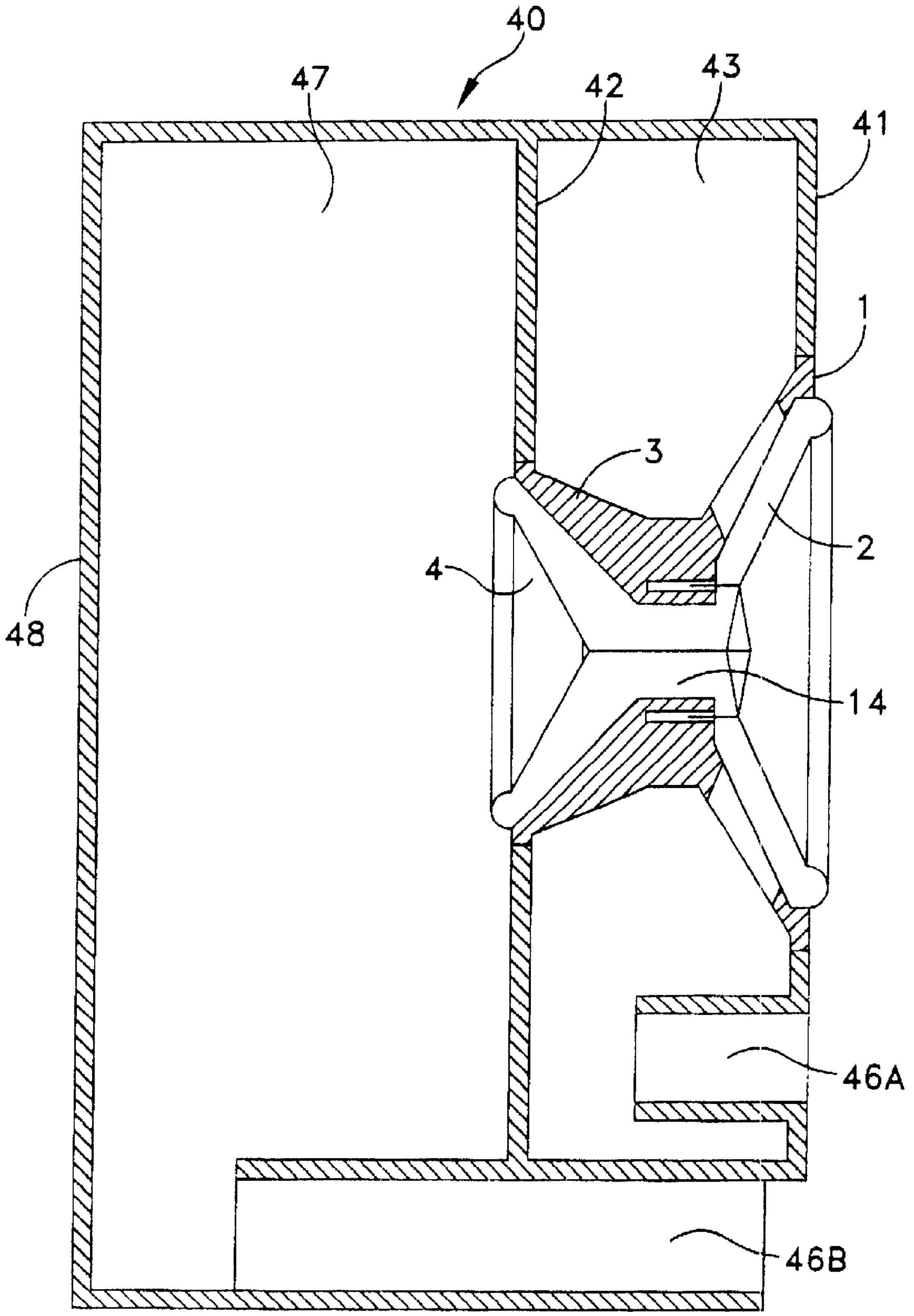
FIG. 3 is a cross section of a third embodiment of a loudspeaker system constructed in accordance with this invention.

The loudspeaker system in FIG. 3 includes an enclosure 40 that carries the loudspeaker main frame 1 on a front panel 41 so that the front surfaces of the primary and secondary speaker cones 2 and 4 interact with the air on the exterior of the enclosure 40. A dividing wall 42 spaced from the front wall 41 serves as a boundary between a ported front sub-chamber 43 and a ported rear sub-chamber 47 completed by a rear wall 48. The front and rear sub-chambers 43 and 47 include a passive radiating means in the form of a port 46A and port 46B, respectively.

As in the enclosures in the prior figures, this enclosure 40 and the dual-cone loudspeaker provide an enclosure designer with a greater variety of control variables. Specifically, the rear surface of the secondary speaker cone 4 interacts with the ported rear sub-chamber 47. The rear surface of the primary speaker cone 2 interacts with the ported front sub-chamber 43. Thus the enclosure designer is provided with the ability to control the interaction between the dual-cone loudspeaker with four different sets of variables, namely: the volumes of the ported sub-chamber 47 and sub-chamber 43, the air mass in the port 46A and the air mass in the port 46B.

Figure 4:
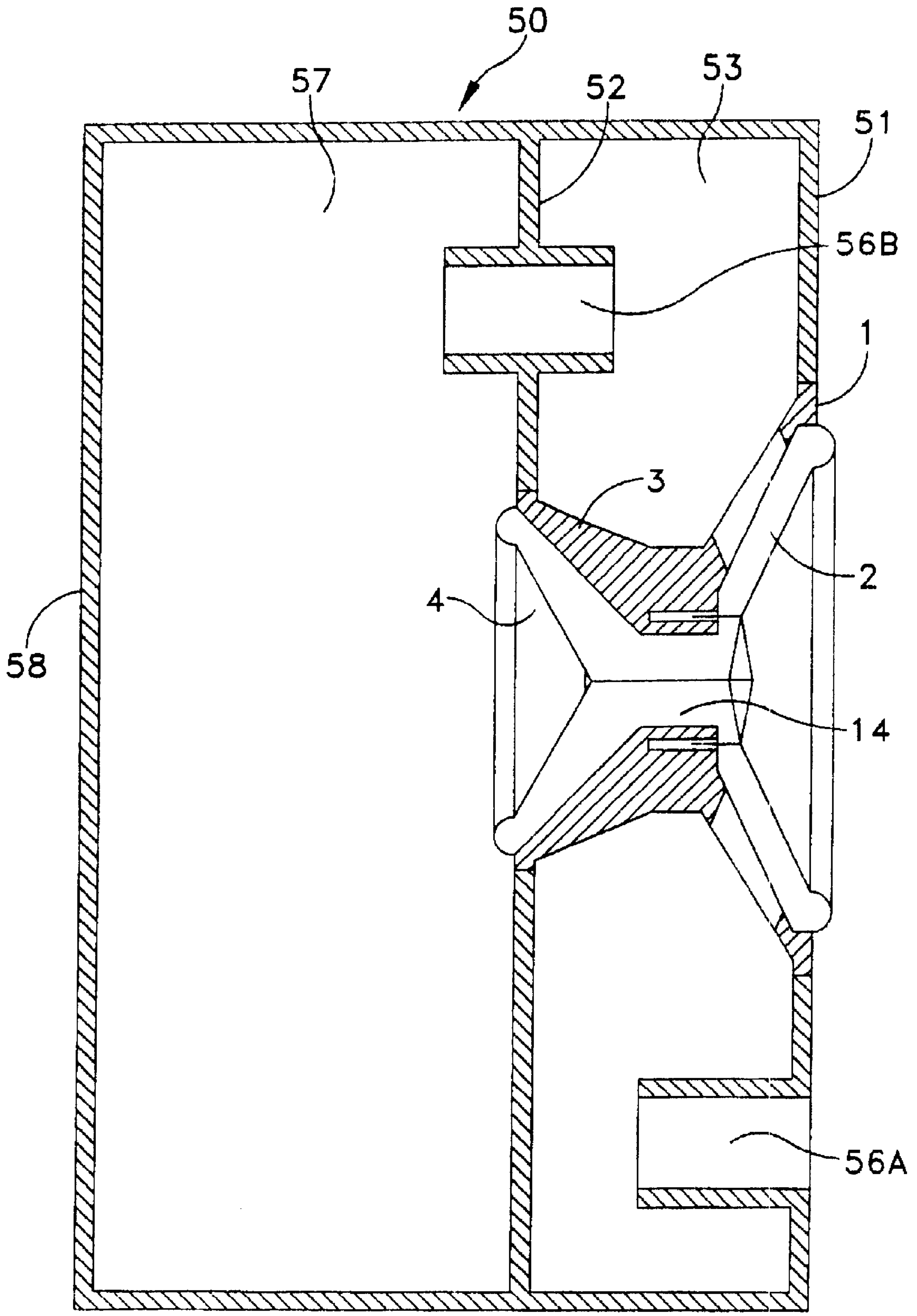
FIG. 4 is a cross section of a fourth embodiment of a loudspeaker system constructed in accordance with this invention.

An enclosure 50 in FIG. 4 carries the loudspeaker main frame 1 on a front panel 51 so that the front surfaces of the primary and secondary speaker cones 2 and 4 interact with the air on the exterior of the enclosure 50. A dividing wall 52 spaced from the front wall 51 serves as a boundary between a ported front sub-chamber 53 and a ported rear sub-chamber 57 completed by a rear wall 58. The front and rear sub-chambers 53 and 57 include a passive radiating means in the form of a port 56A between the sub-chamber 53 and the exterior of the enclosure 50 and a port 56B between the front sub-chamber 53 and the rear sub-chamber 57.

In FIG. 4, the rear surface of the secondary speaker cone 5 interacts with the ported rear sub-chamber 57 while the rear surface of the primary speaker cone 2 interacts with the air in the ported front sub-chamber 53. Consequently this configuration also provides four different sets of variables, namely: the volumes of the ported sub-chamber 53 and the ported sub-chamber 57, the air mass in the port 56A and the air mass in the port 56B.

Figure 5:
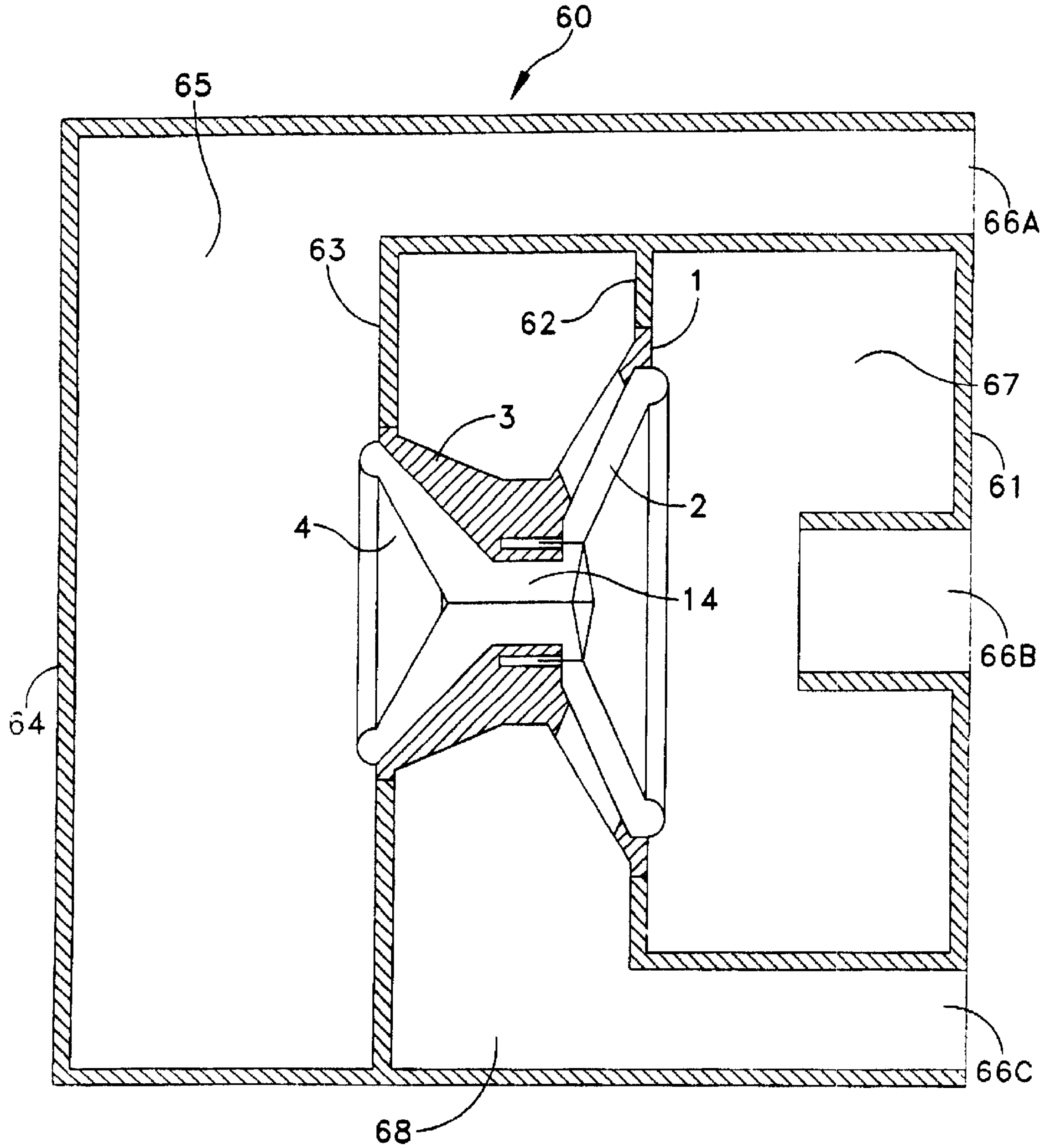
FIG. 5 is a cross section of a fifth embodiment of a loudspeaker system constructed in accordance with this invention.

In FIG. 5 an enclosure 60 has three sub-chambers with a front panel 61, a first dividing wall 62, a second dividing wall 63 and a rear wall 64 that define a ported rear sub-chamber 65 having a port 66A to the exterior of the enclosure 60 through the front panel 61. A port 66B provides a passage from a front sub-chamber 67 to the exterior of the enclosure 60 through the front panel 61; a port 66C performs a similar function with respect to a central sub-chamber 68. The dividing wall 62 is positioned to direct the speaker cone 2 into the front sub-chamber 67. The dividing wall 63 is located so the rear speaker cone 4 faces the rear sub-chamber 65.

In FIG. 5, the rear surface of the secondary speaker cone 4 interacts with the ported rear sub-chamber 65; the rear surface of the primary speaker cone 4, with the ported central sub-chamber 68. The front surfaces of the primary and secondary speaker cones 2 and 4 interact with the ported front sub-chamber 67. Thus the enclosure designer is provided with the ability to control the interaction between the dual-cone loudspeaker with six sets of variables, namely: the volumes of the ported sub-chambers 65, 67 and 68 and the air masses in the ports 66A, 66B and 66C.

Figure 6:
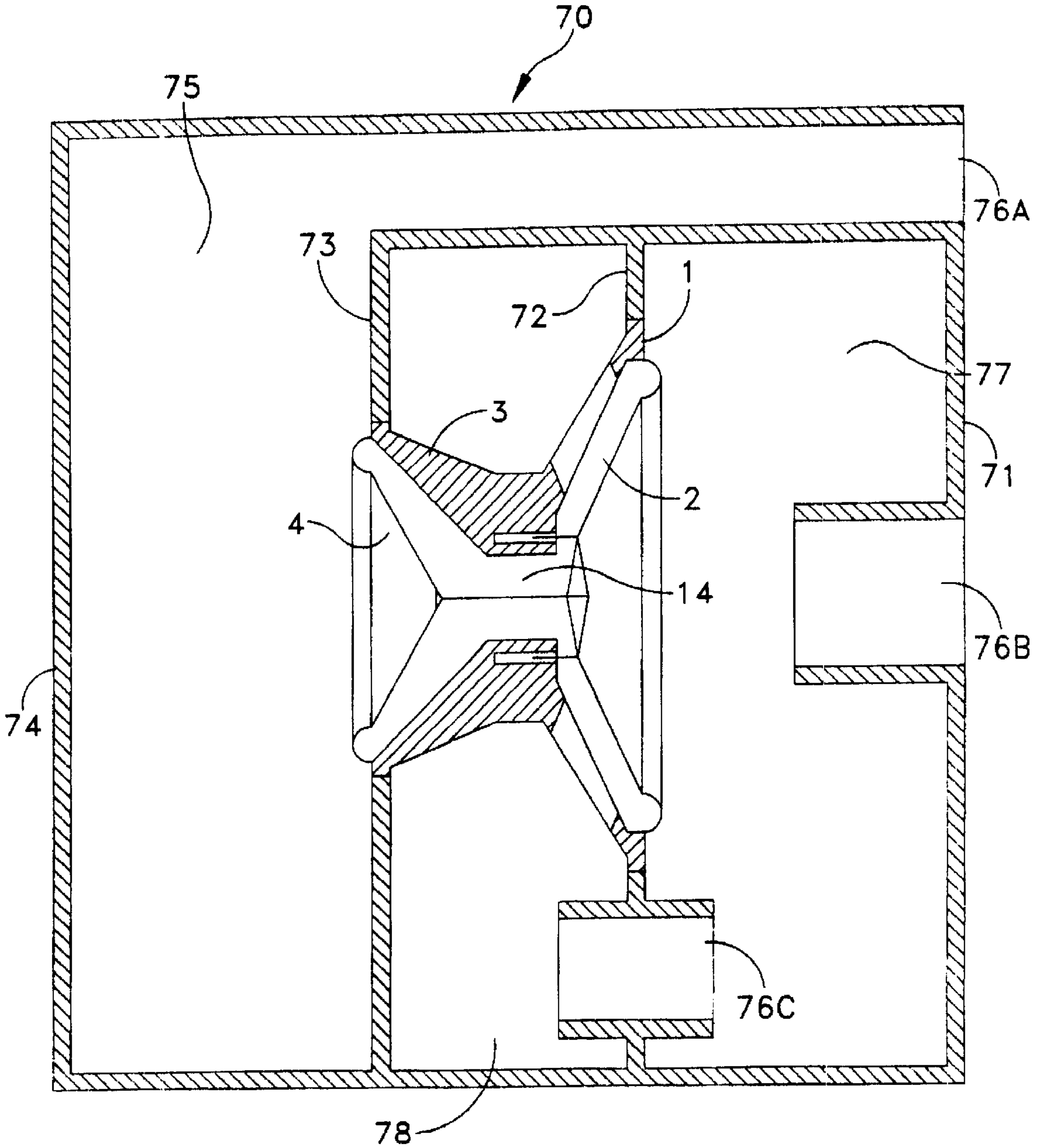
FIG. 6 is a cross section of a sixth embodiment of a loudspeaker system constructed in accordance with this invention

An enclosure 70 in FIG. 6 also includes three sub-chambers with a front panel 71, a first or forward dividing wall 72, a second or rear dividing wall 73 and a rear wall 74. The walls 73 and 74 define a rear sub-chamber 75 having a port 76A to the exterior of the enclosure 70 through the front panel 71. A port 76B provides a passage from a front sub-chamber 77 between the walls 71 and 72 to the exterior of the enclosure 70 through the front panel 71. A port 76C forms a passage between a central sub-chamber 78 between the walls 72 and 73 and the front sub-chamber 77. The dividing wall 72 is positioned to direct the speaker cone 2 into the front sub-chamber 77. The dividing wall 73 is located so the rear speaker cone 4 faces the rear sub-chamber 75.

In FIG. 6, the rear surface of the secondary speaker cone 4 interacts with the ported rear sub-chamber 75. The front surface of the secondary speaker cone 4 and the front surface of the primary speaker cone 2 interact with the ported front sub-chamber 78. The rear surface of the primary speaker cone 2 interacts with the ported central sub-chamber 78. Thus the enclosure designer can use six sets of variables associated with the volumes of the ported sub-chambers 75, 77 and 78 and the air masses in the ports 76A, 76B and 76C.

Figure 7:
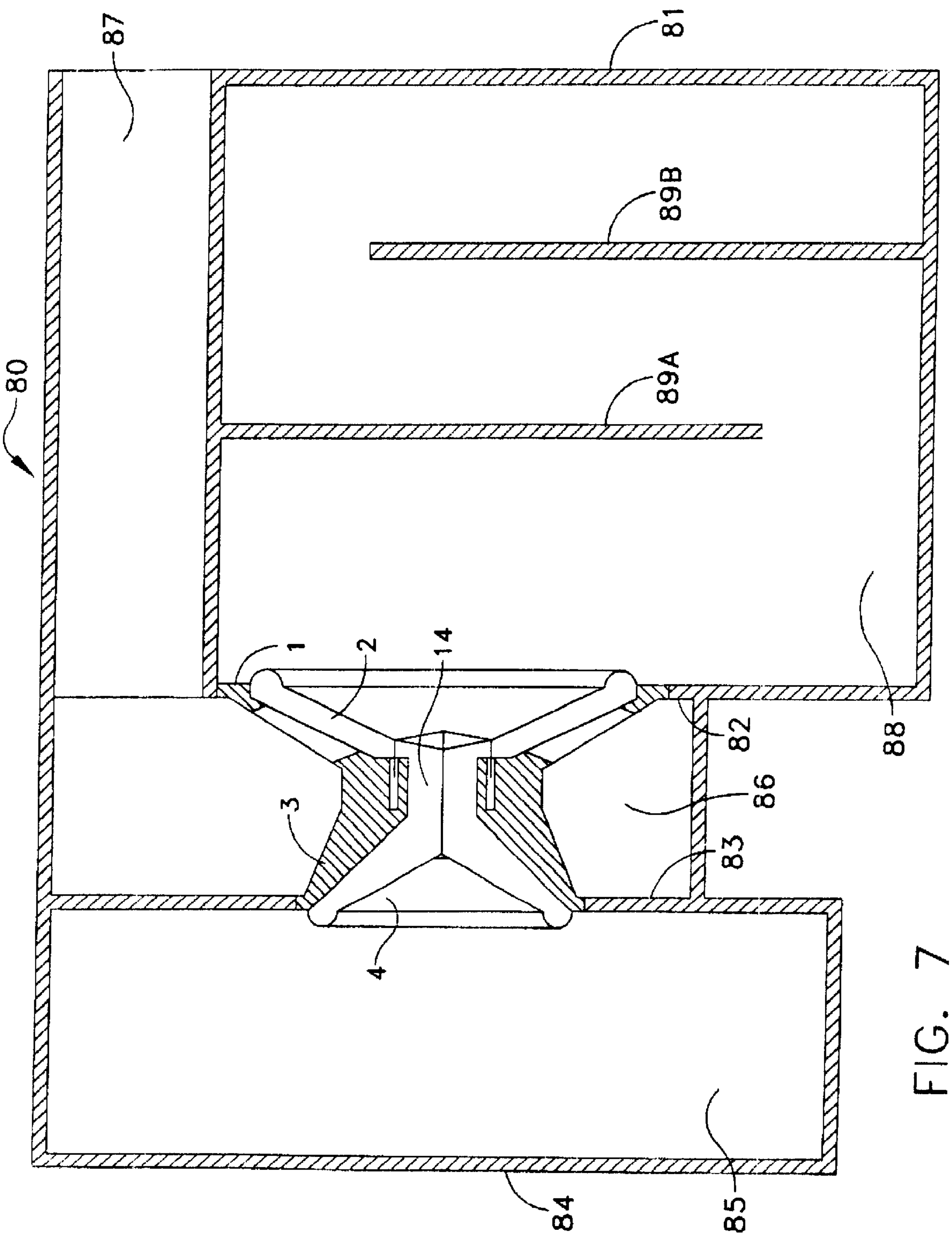
FIG. 7 is a cross section of a seventh embodiment of a loudspeaker system constructed in accordance with this invention.

FIG. 7 depicts an enclosure 80 with two sub-chambers and a third sub-chamber in the form of a sealed acoustic waveguide. The enclosure includes a front panel 81, a first or forward dividing wall 82, a second or rear dividing wall 83 and a rear wall 84. The walls 83 and 84 define a sealed rear sub-chamber 85. The walls 82 and 83 form a ported central sub-chamber 86 with a port 87 to the exterior of the enclosure 80 through the front panel 81. A sealed sub-chamber 88 between the front wall 81 and the first dividing wall 82 defines a sealed front sub-chamber 88 with barriers 89A and 89B that form a labyrinth. With the labyrinth the sub-chamber 88 acts as a sealed acoustic waveguide.

Still referring to FIG. 7, the dividing wall 82 supports the loudspeaker with the front surfaces of the primary speaker cones 2 and 4 directed into the front sub-chamber or acoustic waveguide 88. The dividing wall 83 is located so the rear surface of the speaker cone 4 faces the sealed rear sub-chamber 85. Consequently, the rear surface of the secondary speaker cone 4 interacts with the sealed rear sub-chamber 85. The rear surface of the primary speaker cone 2 acts on the air mass in the ported central sub-chamber 86. This embodiment then provides four sets of variables, namely: the volume of the sealed sub-chamber 85 and the ported sub-chamber 86, the air mass in the port 87 and the properties of the acoustic waveguide 88.

Figure 8:
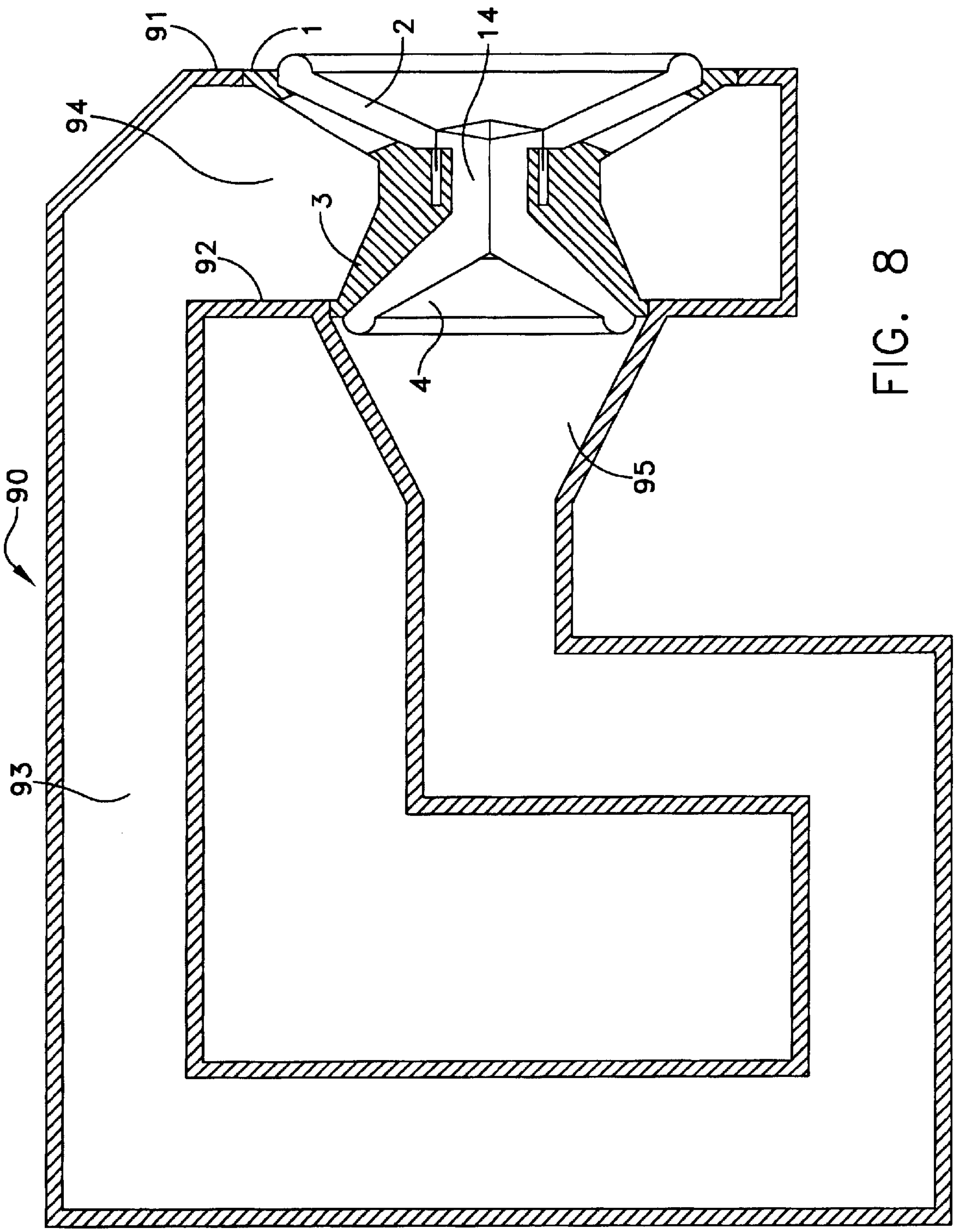
FIG. 8 is a cross section of an eighth embodiment of a loudspeaker system constructed in accordance with this invention.

FIG. 8 depicts, in schematic form, an enclosure 90 with a ported sub-chamber and an acoustic waveguide. The enclosure includes a front panel 91 and a second parallel wall 92 that defines one end of a sealed waveguide 93 with a first end 94 surrounding the space between the main frame 1 and the subframe frame 3. A second end 95 overlies the rear surface of the secondary speaker 4. In this embodiment the sealed waveguide 93 provides a closed passage, or sub-chamber between the rear surfaces of both the speaker cones 2 and 4. Thus the enclosure designer is provided with the ability to control the interaction of the rear surfaces of the speaker cones by appropriate design of the sealed waveguide 93.

Figure 9:
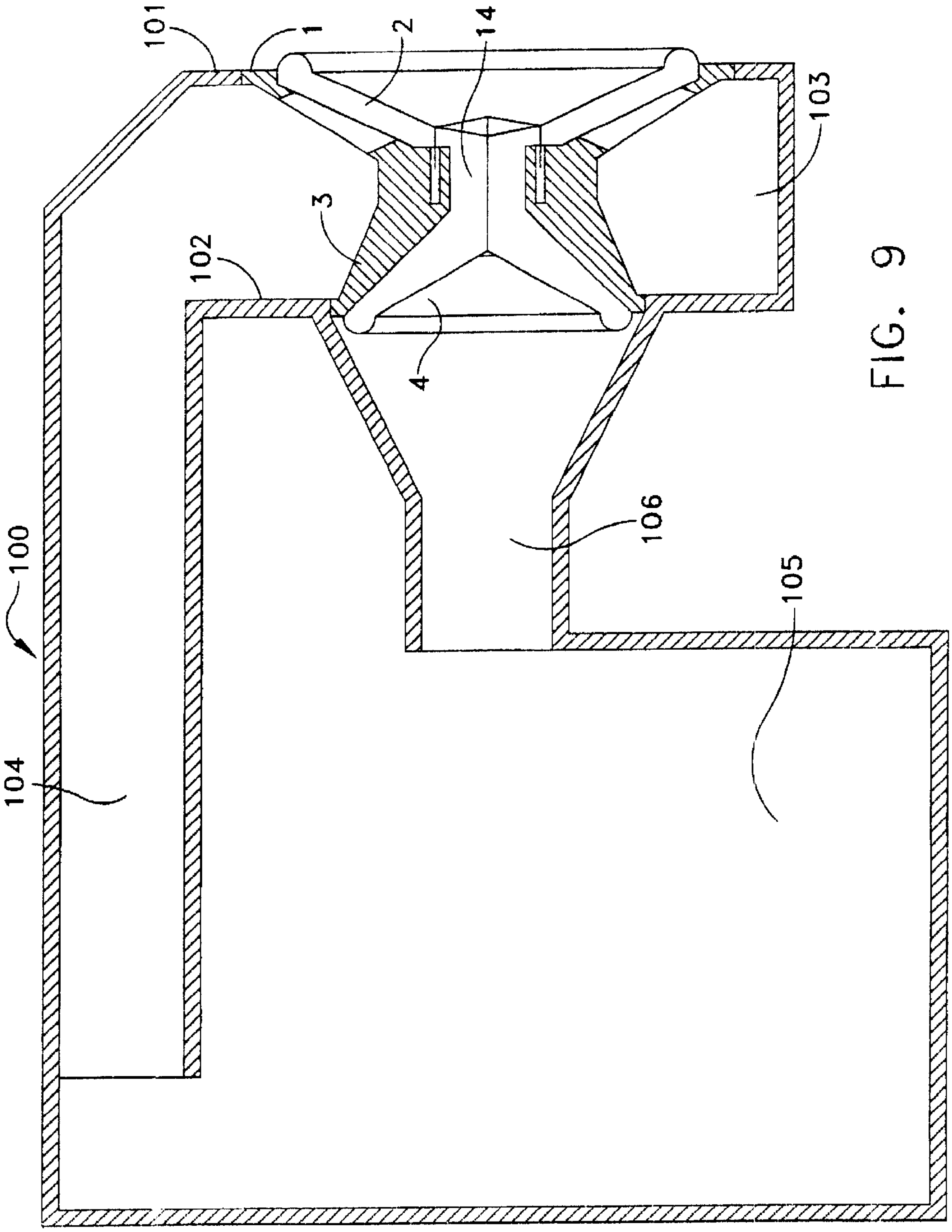
FIG. 9 is a cross section of a ninth embodiment of a loudspeaker system constructed in accordance with this invention.

FIG. 9 depicts, in schematic form, an enclosure 100 with a ported sub-chamber that interacts with the rear surfaces of the speaker cones 2 and 4. The enclosure includes a front panel 101 and a dividing wall 102 that defines a front sub-chamber 103 for interaction with the rear surface of the primary speaker cone 2. A port 104 passes from the front sub-chamber 103 to a rear sub-chamber 105. Another port 106 extends between the rear surface of the secondary speaker cone 4 and the rear sub-chamber 105. Thus the enclosure designer is provided with the ability to control the volumes of the ported front sub-chamber 103 and rear sub-chamber 105 and the air masses in the ports 104 and 106.

Figure 10:
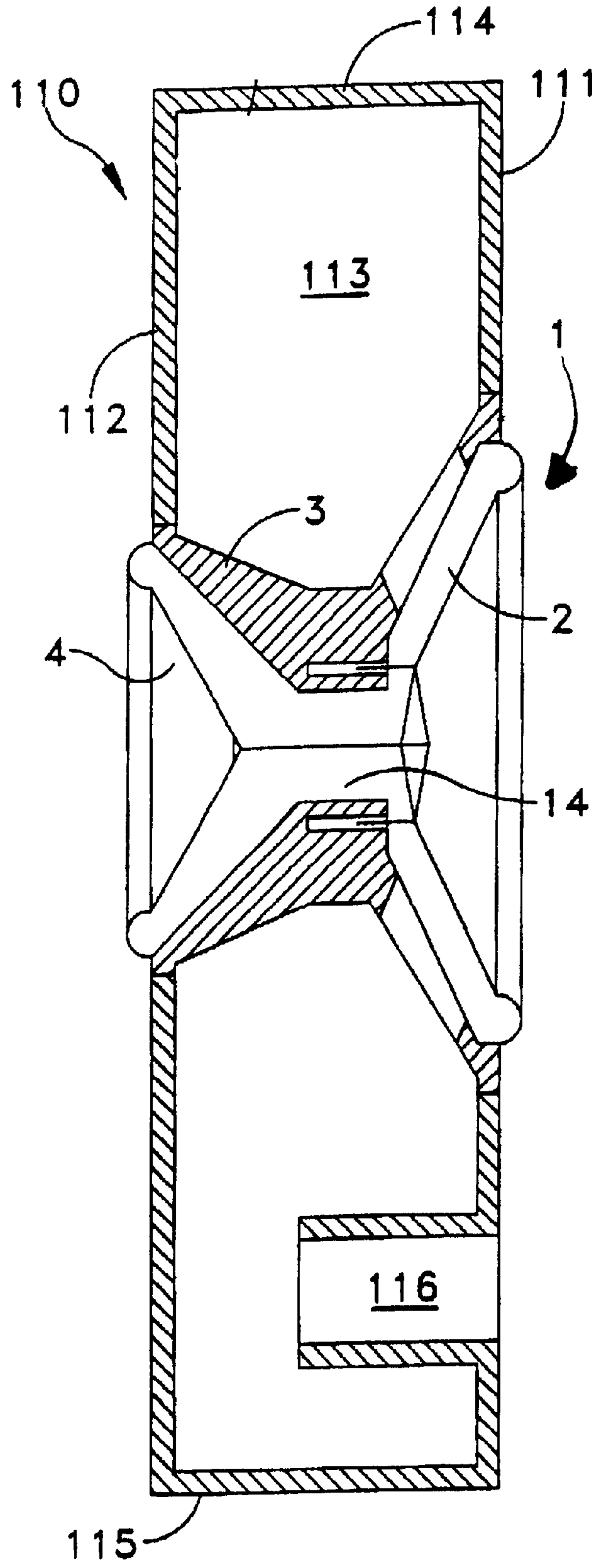
FIG. 10 is a cross section of a tenth embodiment of a loudspeaker system constructed in accordance with this invention.

FIG. 10 depicts, in schematic form, still another embodiment of a loudspeaker enclosure in which an enclosure 110 carries the main frame 1 of the loudspeaker on a front panel 111 so that the front surface of the primary speaker cone 2 faces the exterior of the enclosure 110. A rear wall 112 spaced from the front wall 111 serves as one boundary of a front sub-chamber 113 is also bounded by a top member 114, a bottom member 115 and the front panel 111. The sub-chamber 113 includes a passive radiating means in the form of a port 116 through the front panel 111. The rear wall 112 also carries the sub-frame 3.

This configuration, made possible by the dual-cone loudspeaker, provides an enclosure designer with a wide-variety of variables for controlling the frequency characteristics of the system including both the enclosure and the loudspeaker. This variety results because the dual-cone loudspeaker has four radiating surfaces that can interface with three or more defined air masses. In FIG. 10, the rear surface of the secondary speaker cone 4 faces the rear of the enclosure and interacts with an air mass to the rear of the enclosure 110. The rear surface of the primary speaker cone 2 faces the ported sub-chamber 113 and interacts with the air mass within the sub-chamber 113. The front surfaces of the secondary speaker cone and the primary speaker cone 2 act on the exterior air mass with the front surface of the secondary speaker cone 4 acting through the orifice 14. Thus the enclosure designer is provided with the ability to control the interaction between the dual-cone loudspeaker with two different sets of variables, namely: the volume of the sub-chamber 113 and the air mass in the port 116.

FIGS. 1 through 10 depict specific embodiments of loudspeaker systems using a dual cone loudspeaker. In each the enclosure designer can select or control the compliance produced by multiple sub-chambers or waveguides or the air masses in passive radiators, such as ports. As will be apparent from these specific embodiments, the location of any particular ported, sealed sub-chamber or waveguide is completely arbitrary. Further, there is no requirement that the sub-chambers or waveguides all be sealed, all be unsealed, or all be ported or even to be a combination of all of those. In whatever form, the dual cone loudspeaker provides the enclosure designer with greater flexibility in selecting various dimensions in order to provide a system that produces a better output response, particularly in the bass region, with maximum speaker efficiency.

This invention has been disclosed in terms of certain embodiments. It will be apparent that many modifications can be made to the disclosed apparatus without departing from the invention. Therefore,. it is the intent of the appended claims to cover all such variations and modifications as come within the true spirit and scope of this invention.

What is claimed as new and desired to be secured by Letters Patent of the United States is:

1. A loudspeaker system comprising:

A) a dual cone loudspeaker having rigidly interconnected primary and secondary speaker cones, each speaker cone having front and back surfaces; and B) an enclosure for said loudspeaker having:

i. a first sub-chamber for defining a first air mass that interacts with the rear surface of said primary speaker cone;

ii. a second sub-chamber for defining a second air mass that interacts with the rear surface of said secondary speaker cone, said front surfaces of said primary and secondary speaker cones acting on a third air mass that is outside said enclosure; and C) a sealed acoustic waveguide connected between said first and second sub-chambers whereby the air mass in the waveguide interacts with the rear surfaces of said primary and secondary speaker cones.

2. A loudspeaker system as recited in claim 1 additionally comprising a port from said first sub-chamber to the exterior of said loudspeaker system.

3. A loudspeaker system as recited in claim 1 wherein said second sub-chamber is sealed.

* * * * *